(12) United States Patent
Yang

(10) Patent No.: US 11,404,445 B2
(45) Date of Patent: Aug. 2, 2022

(54) DISPLAY DEVICE AND DISPLAY DRIVING METHOD

(71) Applicant: Wuhan China Star Optoelectronics Semiconductor Display Technology Co., Ltd., Hubei (CN)

(72) Inventor: Hanning Yang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 428 days.

(21) Appl. No.: 16/603,781

(22) PCT Filed: May 7, 2019

(86) PCT No.: PCT/CN2019/085817
§ 371 (c)(1),
(2) Date: Oct. 8, 2019

(87) PCT Pub. No.: WO2020/191860
PCT Pub. Date: Oct. 1, 2020

(65) Prior Publication Data
US 2021/0335835 A1    Oct. 28, 2021

(30) Foreign Application Priority Data

Mar. 27, 2019    (CN) .......................... 201910236879.2

(51) Int. Cl.
*H01L 27/12*      (2006.01)
*G09G 3/20*       (2006.01)
(Continued)

(52) U.S. Cl.
CPC ........... *H01L 27/1225* (2013.01); *G09G 3/20* (2013.01); *H01L 27/1218* (2013.01);
(Continued)

(58) Field of Classification Search
CPC ... G09G 3/20; H01L 27/1218; H01L 27/1225; H01L 27/156; H01L 27/3234;
(Continued)

(56) References Cited

U.S. PATENT DOCUMENTS 9,329,425 B2 *    5/2016    Chen ................ G02F 1/133606
2010/0097469 A1 *  4/2010    Blank ................ H04N 5/23293
                                                            359/872

(Continued)

FOREIGN PATENT DOCUMENTS

CN     103594498 A    2/2014
CN     105094307 A    11/2015
(Continued)

*Primary Examiner* — Amy R Hsu
(74) *Attorney, Agent, or Firm* — Taft Stettinius & Hollister LLP

(57) ABSTRACT

The application provides a display device and a display driving method. The display device includes a display, a housing, and a camera module arranged between the display and the housing. The display panel comprises a first display area and a second display area. Orthographic projection of the camera module on the display is located in the first display area. Membrane structure in the first display area is composed of transparent materials.

17 Claims, 4 Drawing Sheets

(51) Int. Cl.
    *H04N 5/225*    (2006.01)
    *H04N 5/235*    (2006.01)
    *H01L 27/15*    (2006.01)
    *H01L 27/32*    (2006.01)
(52) U.S. Cl.
    CPC ......... *H04N 5/2257* (2013.01); *H04N 5/2353* (2013.01); *H01L 27/156* (2013.01); *H01L 27/3244* (2013.01)
(58) Field of Classification Search
    CPC ............. H01L 27/3244; H01L 51/5215; H01L 51/5234; H04N 5/2254; H04N 5/2257; H04N 5/2353
    See application file for complete search history.

(56) References Cited

U.S. PATENT DOCUMENTS

2018/0190917 A1* 7/2018 Oh ............................ B32B 7/12
2018/0286930 A1* 10/2018 Gai ........................... G02F 1/15
2018/0324336 A1* 11/2018 Wan ................... G02B 23/2407
2018/0357952 A1* 12/2018 Yang ..................... G09G 3/3208
2019/0214595 A1* 7/2019 Park ..................... H01L 27/3234
2020/0328373 A1* 10/2020 Huang .................. H01L 27/323

FOREIGN PATENT DOCUMENTS

| CN | 106921767 A | 7/2017 |
| CN | 107818989 A | 3/2018 |
| CN | 108254963 A | 7/2018 |
| CN | 108366186 A | 8/2018 |
| CN | 108594524 A | 9/2018 |
| CN | 108598115 A | 9/2018 |
| CN | 108666348 A | 10/2018 |
| CN | 109256047 A | 1/2019 |
| CN | 109286704 A | 1/2019 |

* cited by examiner

DISPLAY DEVICE AND DISPLAY DRIVING METHOD

CROSS-REFERENCE TO RELATED APPLICATIONS

This application is a U.S. National Phase of International PCT Application No. PCT/CN2019/085817 filed May 7, 2019, which claims the benefit of Chinese Patent Application Serial No. 201910236879.2 filed Mar. 27, 2019, the contents of each application are incorporated herein by reference in their entirety.

BACKGROUND OF INVENTION

Field of Invention

The present invention relates to a technical field of display technologies, and more particularly, to a display device and a display driving method.

Description of Prior Art

With the ongoing advancement in science and technology and increasing user requirements on products, full screen display products with a high screen area ratio have become the most desirable in mainstream smartphones.

Current front cameras greatly reduce screen area ratio. A front camera needs a transparent area in a display allowing light to pass therethrough, at the cost that the display cannot display images in the transparent area, thus reducing screen area ratio.

The application provides the following technical solutions in view of the technical issue and proposes.

SUMMARY OF INVENTION

The application provides a display device and a display driving method to address the problems of insufficient screen area ratio among current display devices.

The application provides the following technical solutions to address the technical problems.

The application provides a display device comprising a display panel, a housing, and a camera module arranged between the display panel and the housing;

wherein the display panel comprises a first display area and a second display area, and orthographic projection of the camera module on the display panel is located in the first display area;

membrane structure in the first display area is composed of transparent materials; and the first display area is provided with a first luminescent device unit, and a first anode and a first cathode in the first luminescent device unit are composed of transparent electrodes.

In the application, the first display area is provided with a first substrate and a first thin film transistor unit arranged on the first substrate, and the second display area is provided with a second substrate and a second thin film transistor unit arranged on the second substrate;

structure of the first thin film transistor unit is different from structure of the second thin film transistor unit, and the first substrate is composed of transparent materials.

In the application, the first thin film transistor unit comprises a first active layer located on the first substrate, and the first active layer comprises indium gallium zinc oxide (IGZO);

the second thin film transistor unit comprises a second active layer located on the second substrate, and the second active layer comprises low temperature poly-silicon (LTPS).

In the application, the display device further comprises a main control system;

when the main control system receives a camera signal from the first display area, the first luminescent device unit located in the first display area is in a non-luminous state; and when the main control system receives a display signal from the first display area, the first luminescent device unit located in the first display area is in a luminous state.

In the application, the camera module comprises a shutter, and one surface of the shutter near a of the display panel is composed of reflective materials;

when the main control system receives the camera signal from the first display area, the camera module receives a first electrical signal from the main control system, and the shutter is opened, and the camera module receives external light beams injected from the first display area;

when the main control system receives the display signal from the first display area, the camera module receives a second electrical signal from the main control system, and the shutter is closed, and the camera module reflects light beams emitted from the first luminescent device unit.

In the application, the first display area is in shape of one of a square, a rectangle, and an ellipse.

In the application, a radius of the camera module is 1 to 3 millimeters (mm).

The application provides a display driving method for driving a display device, comprising steps of:

S10. receiving a camera signal from a first display area of the display device and transmitting a first electrical signal to a camera module;

S20. the camera module utilizing the first electrical signal to drive a shutter of the camera module to an opened state and a first luminescent device unit in the first display area to a non-luminous state;

S30. receiving a display signal from the first display area of the display device and transmitting a second electrical signal to the camera module; and S40. the camera module utilizing the second electrical signal to drive the shutter of the camera module to a closed state and the first luminescent device unit in the first display area to a luminous state.

In the display driving method of the application, the step S20 comprises:

S201 where the camera module utilizes the first electrical signal to output a first switching signal and a first lightening signal;

S202 where the first switching signal enables the shutter to be in the opened state; and S203 where the first lightening signal enables the first luminescent device unit to be in the non-luminous state, and external light beams to penetrate the first luminescent device unit into the camera module.

In the display driving method of the application, the step S40 comprises:

S401 the camera module utilizing the second electrical signal to output a second switching signal and a second lightening signal;

S402 the second switching signal enabling the shutter to be in the closed state; and S403 the second lightening signal enabling the first luminescent device unit to be in the luminous state, and to emit light beams outwards through the shutter;

wherein one surface of the shutter near the display device is composed of reflective materials.

In the display driving method of the application, the display device comprises a second display area;

the first display area is provided with a first substrate and a first thin film transistor unit arranged on the first substrate, and the second display area is provided with a second substrate and a second thin film transistor unit arranged on the second substrate;

structure of the first thin film transistor unit is different from structure of the second thin film transistor unit, and the first substrate is composed of transparent materials.

In the display driving method of the application, the first thin film transistor unit comprises a first active layer located on the first substrate, wherein the first active layer comprises indium gallium zinc oxide (IGZO);

the second thin film transistor unit comprises a second active layer located on the second substrate, and the second active layer comprises low temperature poly-silicon (LTPS).

In the display driving method of the application, the first display area is in shape of one of a square, a rectangle, and an ellipse.

The application provides a display device comprising a display panel, a housing, and a camera module arranged between the display panel and the housing;

wherein the display panel comprises a first display area and a second display area, and orthographic projection of the camera module on the display panel is located in the first display area;

wherein membrane structure in the first display area is composed of transparent materials.

In the display device of the application, the first display area is provided with a first substrate and a first thin film transistor unit arranged on the first substrate, and the second display area is provided with a second substrate and a second thin film transistor unit arranged on the second substrate;

structure of the first thin film transistor unit is different from structure of the second thin film transistor unit, and the first substrate is composed of transparent materials.

In the display device of the application, the first thin film transistor unit comprises a first active layer located on the first substrate, wherein the first active layer comprises indium gallium zinc oxide (IGZO);

the second thin film transistor unit comprises a second active layer located on the second substrate, and the second active layer comprises low temperature poly-silicon (LTPS).

In the display device of the application, the display device further comprises a main control system;

when the main control system receives a camera signal from the first display area, the first luminescent device unit located in the first display area is in a non-luminous state;

when the main control system receives a display signal from the first display area, the first luminescent device unit located in the first display area is in a luminous state.

In the display device of the application, the camera module comprises a shutter; and one surface of the shutter near the display panel is composed of reflective materials;

when the main control system receives the camera signal from the first display area, the camera module receives a first electrical signal from the main control system, and the shutter is opened, and the camera module receives external light beams injected from the first display area;

when the main control system receives the display signal from the first display area, the camera module receives a second electrical signal from the main control system, and the shutter is closed, and the camera module reflects light beams emitted from the first luminescent device unit.

In the display device of the application, the first display area is in shape of one of a square, a rectangle, and an ellipse.

In the display device of the application, a radius of the camera module is 1 to 3 millimeters (mm).

Useful effects: The application provides a display device and a display driving method. The display device includes a display panel, a housing, and a camera module arranged between the display panel and the housing. The display panel comprises a first display area and a second display area. Orthographic projection of the camera module on the display is located in the first display area. Membrane structure in the first display area is composed of transparent materials. This application makes the first display area in the display panel a controllable area, where the first display area corresponds to the camera module. When the camera module is in operation, the first display area is transparent. When the camera module is turned off, the first display area performs display functions normally, which increase the screen area of the display device.

BRIEF DESCRIPTION OF DRAWINGS

To clearly disclose the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF PREFERRED EMBODIMENTS

Figure 1:
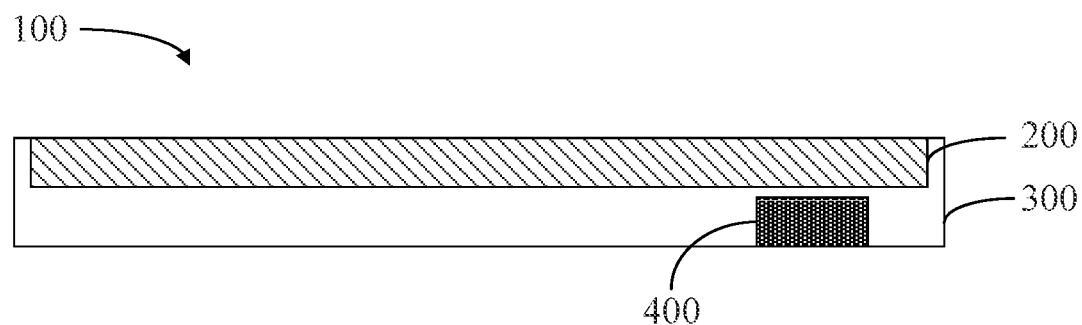
FIG. 1 is a cross sectional view of a display device of the application.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

Please refer to FIG. 1 which is a cross sectional view of a display device 100 of the application.

The display device 100 includes a display panel 200, a housing 300, and a camera module 400 arranged between the display panel 200 and the housing 300.

In the embodiment, the camera module 400 may include an image capture lens.

Figure 2:
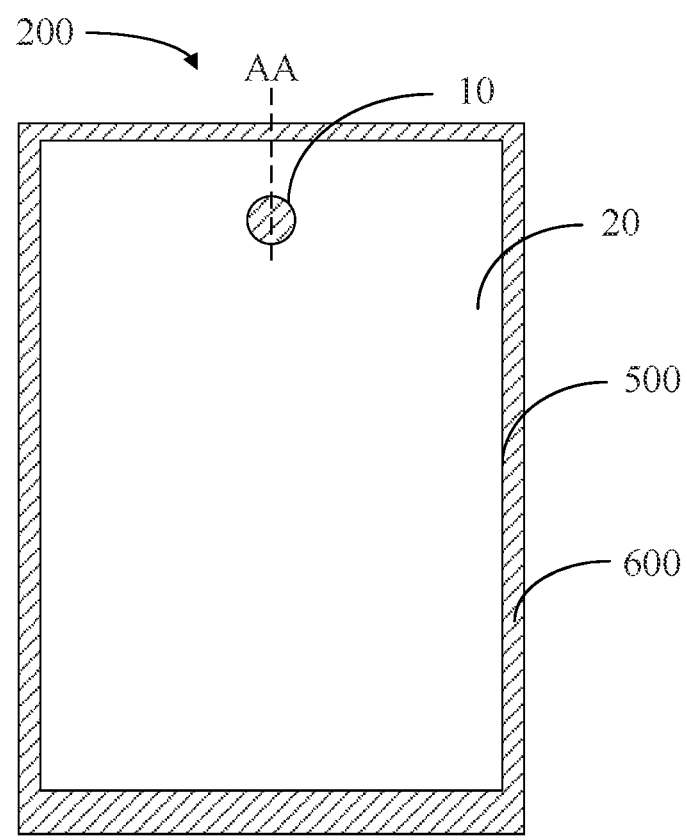
FIG. 2 is a structural view of a display panel in a display device of the application.

Please refer to FIG. 2, which is a structural view of a display panel in a display device of the application.

The display panel 200 includes a display area 500 and a non-display area 600 arranged outside of the display area 500. A plurality of pixels are distributed as pixel arrays in the display area 500.

The display area 500 includes a first display area 10 and a second display area 20.

In the embodiment, a radius of the first display area 10 can be 1-3 millimeters.

Orthographic projection of the camera module 400 on the display panel 200 is located in the first display area 10. In the embodiment, membrane structure in the first display area 10 is composed of transparent materials.

Figure 3:
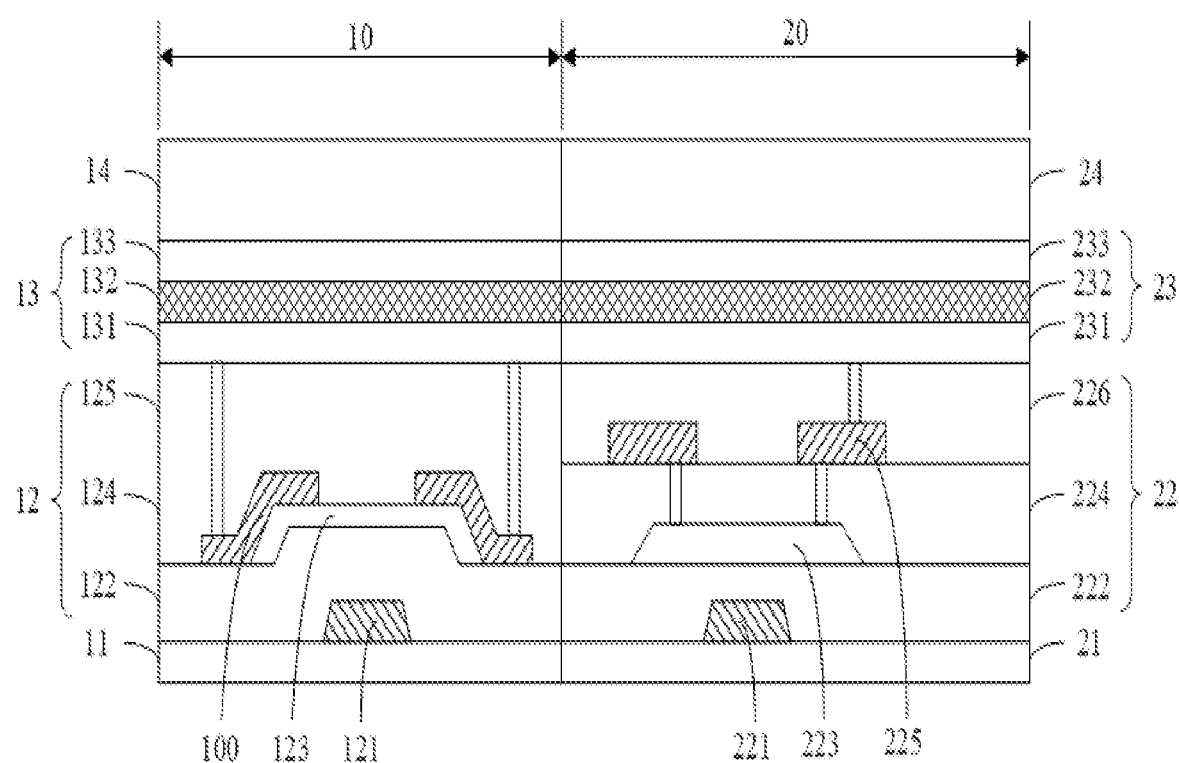
FIG. 3 is a cross sectional view of FIG. 2 along a section AA.

Please refer to FIG. 3, which is a cross sectional view of FIG. 2 along a section AA.

The first display area 10 is provided with a first substrate 11, a first thin film transistor (TFT) unit 12 arranged on the first substrate 11, a first luminescent device unit 13 arranged on the first thin film transistor unit 12, and a first package layer 14 arranged on the first luminescent device unit 13.

The second display area 20 is provided with a second substrate 21, a second thin film transistor unit 22 arranged on the second substrate 21, a second luminescent device unit 23 arranged on the second thin film transistor unit 22, and a second package layer 24 arranged on the second luminescent device unit 23.

In the embodiment, the structure of the first thin film transistor unit 12 is different from the structure of the second thin film transistor unit 22, and the first substrate 11 is composed of transparent materials.

In the embodiment, the first thin film transistor unit 12 comprises indium gallium zinc oxide (IGZO) TFTs. The second thin film transistor unit 22 comprises low temperature poly-silicon (LTPS) TFTs.

The first thin film transistor unit 12 comprises a first gate layer 121 located on the first substrate 11, a first gate insulating layer 122 located on the first gate layer 121, a first active layer 123 located on the first gate insulating layer 122, and a first source drain layer 124 on the first active layer 123, and a first interlayer insulating layer 125 located on the first source drain layer 124.

In the embodiment, membrane structure in the first thin film transistor unit 12 is composed of transparent materials.

In the embodiment, the thickness of the first thin film transistor unit 12 can be 5-20 microns.

In the embodiment, the first substrate 11 is made up of transparent materials. The material of the first substrate 11 may include transparent polyimide.

In the embodiment, a radius of the first substrate 11 may be 1-3 mm.

In the embodiment, the first active layer 123 can be IGZO.

In the embodiment, the first luminescent device unit 13 may include the first anode 131, the first luminescent unit 132, and the first cathode 133. The first anode 131 and the first cathode 133 are formed from transparent materials.

In the application, pixels in the first display area 10 is made transparent through use of transparent electrodes instead of traditional metal reflective electrodes, and through use of substrate material which is completely transparent in visible light bands instead of traditional polyimide materials which is not fully transparent in visible light bands.

In the embodiment, the size of the first anode 131 and the first cathode 133 may be 5-20 microns.

In the embodiment, the first package layer 14 is made up of transparent materials.

Refer to FIG. 3, the second thin film transistor unit 22 comprises a second gate layer 221 located on the second substrate 21, a second gate insulating layer 222 located on the second gate layer 221, the second active layer 223 on the second gate insulating layer 222, a second interlayer insulating layer 224 on the second active layer 223, a second source drain layer 225 located on the second interlayer insulating layer 224, and a second flat layer 226 on the second source drain layer 225.

In the embodiment, the second active layer 223 may be LTPS.

In the embodiment, the first substrate 11 and the second substrate 21 are of the same thickness.

In the embodiment, the second thin film transistor unit 22 may be composed of non-transparent materials.

Because electronic migration rate of IGZO thin film transistors is lower than that of the LTPS thin film transistors, TFTs in the first display area 10 corresponding to the camera module 400 is made from IGZO TFTs to improve the efficiency of the display device 100 in the application.

In the embodiment, the second luminescent device unit 23 comprises a second anode 231, a second luminescent unit 232 and a second cathode 233. The second anode 231 and the second cathode 233 may be composed of conventional metal materials and form a microcavity effect from total reflection materials and semi-reflective materials.

Figure 4:
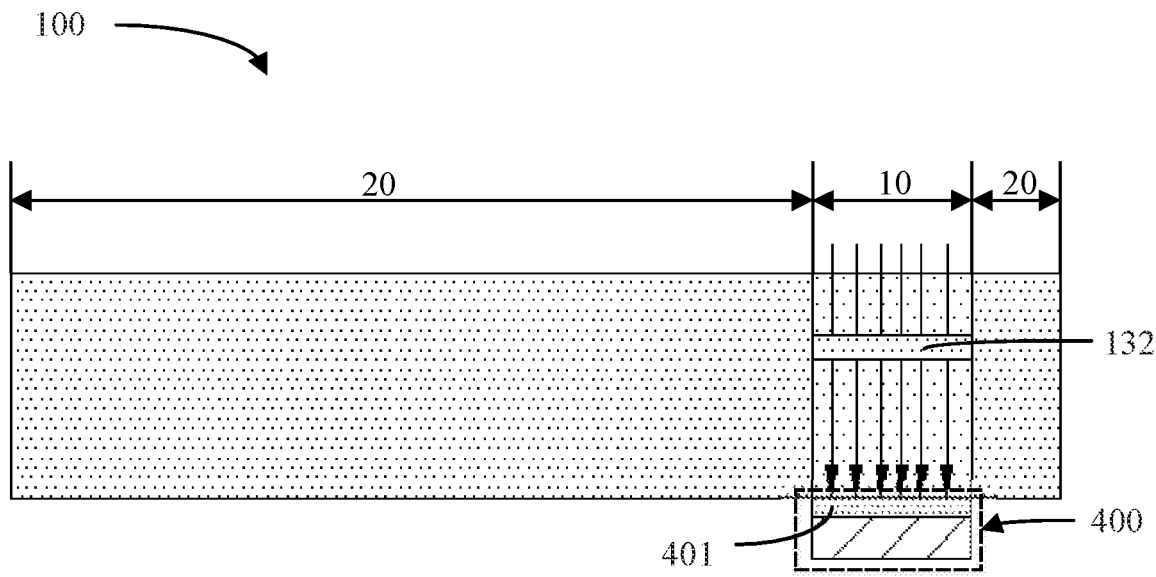
FIG. 4 is a schematic view of a camera module of the display device of the application in an operation state.

Please refer to FIG. 4, which is a schematic view of the camera module 400 of the display device 100 of the application in an operation state.

Figure 5:
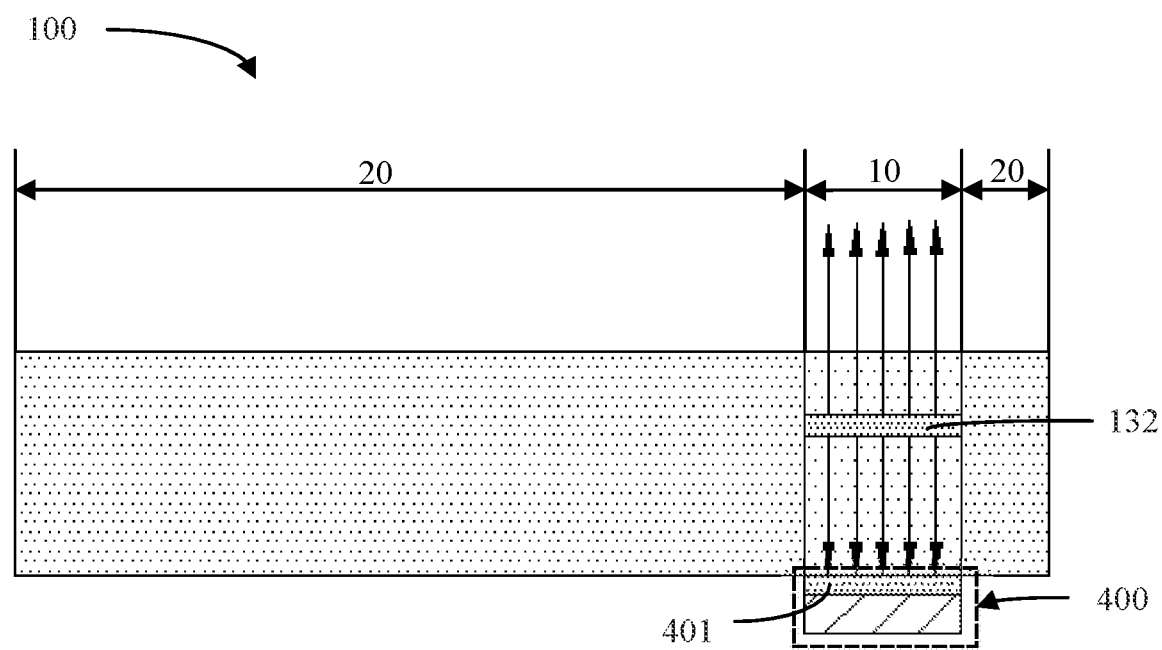
FIG. 5 is a schematic view of the camera module of the display device of the application in a non-operation state.

Please refer to FIG. 5, which is a schematic view of the camera module 400 of the display device 100 of the application in a non-operation state.

The camera module 400 comprises a shutter 401. One surface of the shutter 401 near the display panel 200 is composed of reflective materials. The shutter 401 in the application may reflect light beams emitted from the first luminescent device unit 13.

In the embodiment, in the operation state of the camera module 400, the first display area 10 functions as a translucent area, the first luminescent device unit 13 in the first display area 10 is in a non-luminous state, the shutter 401 of the camera module 400 is opened, ambient light beams penetrate the first display area 10 and enter the camera module 400, and the camera module 400 receives external ambient light beams injected from the first display area 10.

In the non-operation state of the camera module 400, the first display area 10 functions as a display area, the first luminescent device unit 13 in the first display area 10 is in luminous state, the shutter 401 of the camera module 400 is closed and reflects light beams emitted from the first luminescent device unit 13, and the first display area 10 displays images as normal.

In the application, the display device 100 also includes a main control system.

When a user invokes the camera module 400, the main control system receives a camera signal emitted from the first display area 10 and outputs a first electrical signal to the camera module 400 according to the camera signal. The camera module 400 outputs a first switching signal and a first lightening signal according to the first electrical signal.

In the embodiment, the first switching signal makes the shutter 401 open, the first lightening signal makes the first luminescent device unit 13 in a non-luminous state, the external light beams penetrate the first light device into the camera module 400.

In the embodiment, the first switching signal enables the shutter 401 to be in the opened state. The first lightening signal enables the first luminescent device unit 13 to be in the non-luminous state, and external light beams to penetrate through the first luminescent device unit 13 into the camera module 400.

When a user closes the camera module 400, the main control system receives a display signal emitted from the first display area 10 and outputs a second electrical signal to the camera module 400 according to the display signal. The camera module 400 outputs a second switching signal and a second lightening signal according to the second electrical signal.

In the embodiment, the second switching signal enables the shutter 401 to be in a closed state, and the second lightening signal enables the first luminescent device unit 13 to be in a luminous state, and the light beams emitted by the first light device is reflected by the shutter 401 to the outside world.

When the camera module 400 is in the non-operation state, the shutter 401 is closed, and the camera module 400 reflects the light beams emitted by the luminescent device unit, which not only enhances the brightness of the pixels in the first display area 10, but also avoid damages to the camera module 400 caused by the light emitted by the first luminescent device unit 13.

In the embodiment, the first display area 10 is in shape of a square, a rectangle, or an ellipse.

In the embodiment, a radius of the camera module 400 may be 1-3 mm.

The first display area of the application may be controllable through the above design, and further improves screen area on the display device 100 without affecting a camera function of the display device 100.

Figure 6:
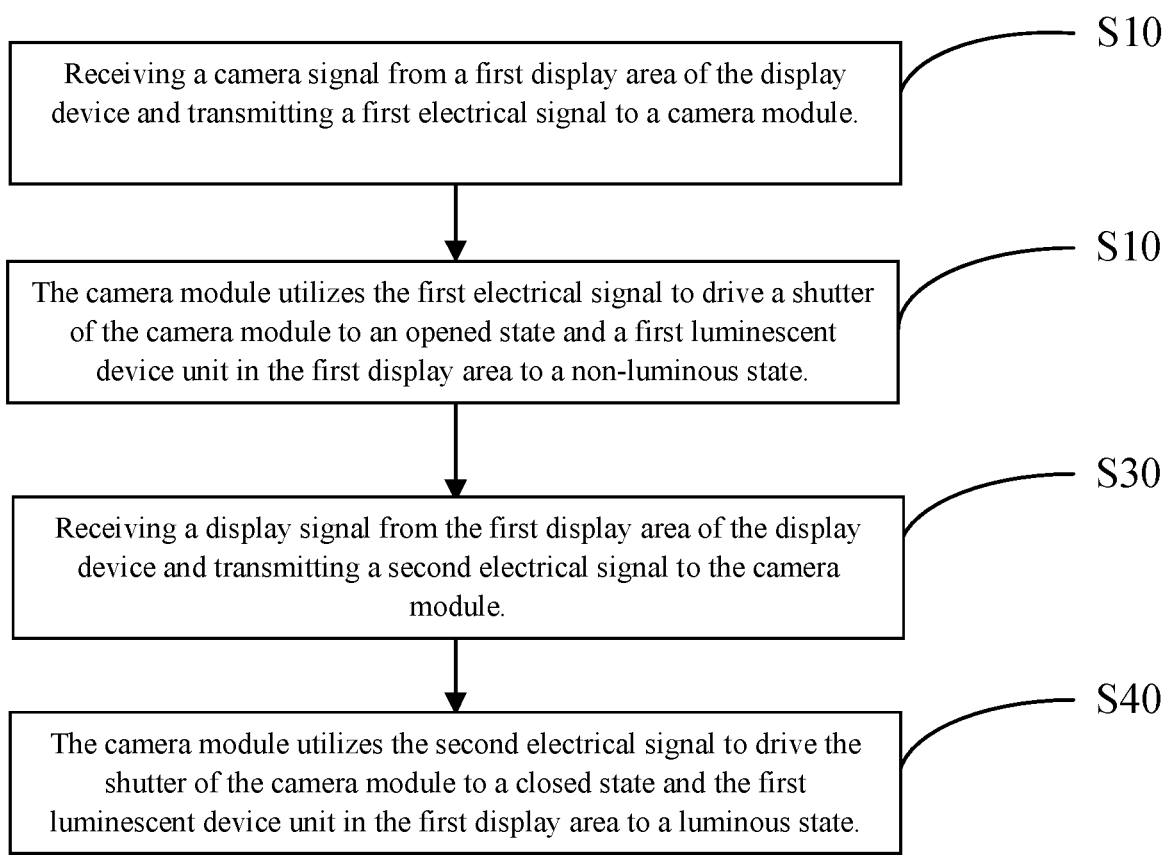
FIG. 6 is a schematic view showing steps of a display driving method of the display device of the application.

Please refer to FIG. 6, which is a schematic view showing steps of a display driving method or driving the display device 100 of the application.

The display driving method or driving the display device 100 comprises steps of:

S10: receiving a camera signal from the first display area 10 of the display device 100 and transmitting a first electrical signal to the camera module 400;

Please refer to FIG. 1, the display device 100 includes a display panel 200, a housing, and a camera module 400 arranged between the display panel 200 and the housing.

In the embodiment, the camera module 400 may include an image capture lens.

Please refer to FIG. 2, the display panel 200 includes a display area 500 and a non-display area 600 arranged outside of the display area 500. A plurality of pixels are distributed as pixel arrays in the display area 500.

The display area 500 includes a first display area 10 and a second display area 20.

In the embodiment, a radius of the first display area 10 can be 1-3 millimeters.

Orthographic projection of the camera module 400 on the display panel 200 is located in the first display area 10. In the embodiment, membrane structure in the first display area 10 is composed of transparent materials.

In the step, when a user invokes the camera module 400, the main control system receives a camera signal emitted from the first display area 10 and outputs a first electrical signal to the camera module 400 according to the camera signal.

S20: the camera module 400 utilizing the first electrical signal to drive a shutter 401 of the camera module 400 to an opened state and a first luminescent device unit 13 in the first display area 10 to a non-luminous state;

The step S20 may comprise:

S201: the camera module 400 utilizing the first electrical signal to output a first switching signal and a first lightening signal;

S202: the first switching signal enabling the shutter 401 to be in the opened state; and S203: the first lightening signal enabling the first luminescent device unit 13 to be in the non-luminous state, and external light beams to penetrate the first luminescent device unit 13 into the camera module 400.

Please refer to FIG. 4, the camera module 400 comprises the shutter 401. One surface of the shutter 401 near the display panel 200 is composed of reflective materials. The shutter 401 in the application may reflect light beams emitted from the first luminescent device unit 13.

In the embodiment, in the operation state of the camera module 400, the first display area 10 functions as a translucent area, the first luminescent device unit 13 in the first display area 10 is in non-luminous state, the shutter 401 of the camera module 400 is opened, ambient light beams penetrate the first display area 10 and enter the camera module 400, and the camera module 400 receives external ambient light beams injected from the first display area 10.

S30. receiving a display signal from the first display area 10 of the display device 100 and transmitting a second electrical signal to the camera module 400;

In this step, when the user closes the camera module 400, the main control system receives a display signal emitted by the first display area 10, and outputs the second electrical signal the camera module 400 according to the display signal.

S40. the camera module 400 utilizing the second electrical signal to drive the shutter 401 of the camera module 400 to a closed state and the first luminescent device unit 13 in the first display area 10 to a luminous state.

The step S40 may comprise:

S401 the camera module 400 utilizing the second electrical signal to output a second switching signal and a second lightening signal;

S402 the second switching signal enabling the shutter 401 to be in the closed state; and S403 the second lightening signal enabling the first luminescent device unit 13 to be in the luminous state, and to emit light beams outwards through the shutter 401;

Please refer to FIG. 5, in the non-operation state of the camera module 400, the first display area 10 functions as a display area, the first luminescent device unit 13 in the first display area 10 is in luminous state, the shutter 401 of the camera module 400 is closed and reflects light beams emitted from the first luminescent device unit 13, and the first display area 10 displays images as normal.

In the embodiment, when the camera module 400 is in the non-operation state, the shutter 401 is closed, and the camera module 400 reflects the light beams emitted by the luminescent device unit, which not only enhances the brightness of the pixels in the first display area 10, but also avoid damages to the camera module 400 caused by the light emitted by the first luminescent device unit 13.

Because the first display area 10 is a transparent area, and the second display area 20 is a non-transparent area, the first display area and the second display area have some structural differences.

Please refer to FIG. 3, the first display area 10 is provided with the first substrate 11, the first thin film transistor (TFT) unit 12 arranged on the first substrate 11, the first luminescent device unit 13 arranged on the first thin film transistor unit 12, and the first package layer 14 arranged on the first luminescent device unit 13.

The second display area 20 is provided with the second substrate 21, the second thin film transistor unit 22 arranged on the second substrate 21, the second luminescent device unit 23 arranged on the second thin film transistor unit 22, and the second package layer 24 arranged on the second luminescent device unit 23.

In the embodiment, the structure of the first thin film transistor unit 12 is different from the structure of the second thin film transistor unit 22.

In the embodiment, the first thin film transistor unit 12 comprises IGZO TFTs. The second thin film transistor unit 22 comprises LTPS TFTs.

The first thin film transistor unit 12 comprises the first gate layer 121 located on the first substrate 11, the first gate insulating layer 122 located on the first gate layer 121, the first active layer 123 located on the first gate insulating layer 122, and the first source drain layer 124 on the first active layer 123, and the first interlayer insulating layer 125 located on the first source drain layer 124.

In the embodiment, membrane structure in the first thin film transistor unit 12 is composed of transparent materials.

In the embodiment, the thickness of the first thin film transistor unit 12 can be 5-20 microns.

In the embodiment, the first substrate 11 is made up of transparent materials. The material of the first substrate 11 may include transparent polyimide.

In the embodiment, a radius of the first substrate 11 may be 1-3 mm.

In the embodiment, the first active layer 123 can be IGZO.

In the embodiment, the first luminescent device unit 13 may include the first anode 131, the first luminescent unit 132, and the first cathode 133. The first anode 131 and the first cathode 133 are formed from transparent materials.

In the application, pixels in the first display area 10 is made transparent through use of transparent electrodes instead of traditional metal reflective electrodes, and through use of substrate material which is completely transparent in visible light bands instead of traditional polyimide materials which is not fully transparent in visible light bands.

In the embodiment, the size of the first anode 131 and the first cathode 133 can be 5-20 microns.

In the embodiment, the first package layer 14 is made up of transparent materials.

Refer to FIG. 3, the second thin film transistor unit 22 comprises the second gate layer 221 located on the second substrate 21, the second gate insulating layer 222 located on the second gate layer 221, the second active layer 223 on the second gate insulating layer 222, the second interlayer insulating layer 224 on the second active layer 223, the second source drain layer 225 located on the second interlayer insulating layer 224, and the second flat layer 226 on the second source drain layer 225.

In the embodiment, the second active layer 223 may be LTPS.

In the embodiment, the first substrate 11 and the second substrate 21 are of the same thickness.

In the embodiment, the second thin film transistor unit 22 may be composed of non-transparent materials.

Because electronic migration rate of IGZO thin film transistors is lower than that of the LTPS thin film transistors, TFTs in the first display area 10 corresponding to the camera module 400 is made from IGZO TFTs to improve the efficiency of the display device 100 in the application.

In the embodiment, the second luminescent device unit 23 comprises a second anode 231, a second luminescent unit 232 and a second cathode 233. The second anode 231 and the second cathode 233 may be composed of conventional metal materials and form a microcavity effect from total reflection materials and semi-reflective materials.

The application provides a display device and a display driving method. The display device includes a display panel, a housing, and a camera module arranged between the display panel and the housing. The display panel comprises a first display area and a second display area. Orthographic projection of the camera module on the display is located in the first display area. Membrane structure in the first display area is composed of transparent materials. This application makes the first display area in the display panel a controllable area, where the first display area corresponds to the camera module. When the camera module is in operation, the first display area is transparent. When the camera module is turned off, the first display area performs display functions normally, which increase the screen area of the display device.

To sum up, the present invention has been described with preferred embodiments thereof and it is understood that many changes and modifications to the described embodiment can be carried out without departing from the scope and the spirit of the invention that is intended to be limited only by the appended claims.

What is claimed is:

1. A display device comprising a display panel, a housing, and a camera module arranged between the display panel and the housing;
   wherein the display panel comprises a first display area and a second display area, and orthographic projection of the camera module on the display panel is located in the first display area;
   a membrane structure disposed in the first display area, composed of transparent materials; and
   the first display area is provided with a first luminescent device unit, and a first anode and a first cathode in the first luminescent device unit are composed of transparent electrodes;
   wherein the first display area is provided with a first substrate and a first thin film transistor unit arranged on the first substrate, and the second display area is provided with a second substrate and a second thin film transistor unit arranged on the second substrate; and
   structure of the first thin film transistor unit is different from structure of the second thin film transistor unit, and the first substrate is composed of transparent materials.

2. The display device of claim 1, wherein the first thin film transistor unit comprises a first active layer located on the first substrate, and the first active layer comprises indium gallium zinc oxide (IGZO);
   the second thin film transistor unit comprises a second active layer located on the second substrate, and the second active layer comprises low temperature polysilicon (LTPS).

3. The display device of claim 1, wherein,
   the display device further comprises a main control system;
   when the main control system receives a camera signal from the first display area, the first luminescent device unit located in the first display area is in a non-luminous state; and when the main control system receives a display signal from the first display area, the first luminescent device unit located in the first display area is in a luminous state.

4. The display device of claim 3, wherein the camera module comprises a shutter, and one surface of the shutter near the display panel is composed of reflective materials;
when the main control system receives the camera signal from the first display area, the camera module receives a first electrical signal from the main control system, and the shutter is opened, and the camera module receives external light beams injected from the first display area;
when the main control system receives the display signal from the first display area, the camera module receives a second electrical signal from the main control system, and the shutter is closed, and the camera module reflects light beams emitted from the first luminescent device unit.

5. The display device of claim 1, wherein the first display area is in shape of one of a square, a rectangle, and an ellipse.

6. The display device of claim 1, wherein a radius of the camera module is 1 to 3 millimeters.

7. A display driving method for driving a display device, comprising steps of:
S10. receiving a camera signal from a first display area of the display device and transmitting a first electrical signal to a camera module;
S20. the camera module utilizing the first electrical signal to drive a shutter of the camera module to an opened state and a first luminescent device unit in the first display area to a non-luminous state;
S30. receiving a display signal from the first display area of the display device and transmitting a second electrical signal to the camera module; and
S40. the camera module utilizing the second electrical signal to drive the shutter of the camera module to a closed state and the first luminescent device unit in the first display area to a luminous state;
wherein,
the display device comprises a second display area;
the first display area is provided with a first substrate and a first thin film transistor unit arranged on the first substrate, and the second display area is provided with a second substrate and a second thin film transistor unit arranged on the second substrate;
structure of the first thin film transistor unit is different from structure of the second thin film transistor unit, and the first substrate is composed of transparent materials.

8. The display driving method of claim 7, wherein the step S20 comprises:
S201 where the camera module utilizes the first electrical signal to output a first switching signal and a first lightening signal;
S202 where the first switching signal enables the shutter to be in the opened state; and
S203 where the first lightening signal enables the first luminescent device unit to be in the non-luminous state, and external light beams to penetrate the first luminescent device unit into the camera module.

9. The display driving method of claim 7, wherein the step S40 comprises:
S401 the camera module utilizing the second electrical signal to output a second switching signal and a second lightening signal;
S402 the second switching signal enabling the shutter to be in the closed state; and
S403 the second lightening signal enabling the first luminescent device unit to be in the luminous state, and to emit light beams outwards through the shutter;
wherein one surface of the shutter near the display panel is composed of reflective materials.

10. The display driving method of claim 7, wherein the first thin film transistor unit comprises a first active layer located on the first substrate, and the first active layer comprises indium gallium zinc oxide (IGZO);
the second thin film transistor unit comprises a second active layer located on the second substrate, and the second active layer comprises low temperature polysilicon (LTPS).

11. The display driving method of claim 7, wherein the first display area is in shape of one of a square, a rectangle, and an ellipse.

12. A display device comprising a display panel, a housing, and a camera module arranged between the display panel and the housing;
wherein the display panel comprises a first display area and a second display area, and orthographic projection of the camera module on the display panel is located in the first display area;
wherein membrane structure in the first display area is composed of transparent materials;
wherein the first display area is provided with a first substrate and a first thin film transistor unit arranged on the first substrate, and the second display area is provided with a second substrate and a second thin film transistor unit arranged on the second substrate;
structure of the first thin film transistor unit is different from structure of the second thin film transistor unit, and the first substrate is composed of transparent materials.

13. The display device of claim 12, wherein the first thin film transistor unit comprises a first active layer located on the first substrate, and the first active layer comprises indium gallium zinc oxide (IGZO);
the second thin film transistor unit comprises a second active layer located on the second substrate, and the second active layer comprises low temperature polysilicon (LTPS).

14. The display device of claim 12, wherein,
the display device further comprises a main control system;
when the main control system receives a camera signal from the first display area, the first luminescent device unit located in the first display area is in a non-luminous state;
when the main control system receives a display signal from the first display area, the first luminescent device unit located in the first display area is in a luminous state.

15. The display device of claim 14, wherein the camera module comprises a shutter; and
one surface of the shutter near the display panel is composed of reflective materials;
when the main control system receives the camera signal from the first display area, the camera module receives a first electrical signal from the main control system, and the shutter is opened, and the camera module receives external light beams injected from the first display area;
when the main control system receives the display signal from the first display area, the camera module receives a second electrical signal from the main control system, and the shutter is closed, and the camera module reflects light beams emitted from the first luminescent device unit.

16. The display device of claim 12, wherein the first display area is in shape of one of a square, a rectangle, and an ellipse.

17. The display device of claim 12, wherein a radius of the camera module is 1 to 3 millimeters.

* * * * *